(12) United States Patent
Hui

(10) Patent No.: US 9,274,368 B2
(45) Date of Patent: Mar. 1, 2016

(54) COA SUBSTRATE, METHOD FOR FABRICATING THE SAME AND DISPLAY DEVICE

(71) Applicant: BOE TECHNOLOGY GROUP CO., LTD., Beijing (CN)

(72) Inventor: Guanbao Hui, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/385,273

(22) PCT Filed: Nov. 27, 2013

(86) PCT No.: PCT/CN2013/087973
§ 371 (c)(1),
(2) Date: Sep. 15, 2014

(87) PCT Pub. No.: WO2014/205998
PCT Pub. Date: Dec. 31, 2014

(65) Prior Publication Data
US 2015/0346546 A1 Dec. 3, 2015

(30) Foreign Application Priority Data
Jun. 28, 2013 (CN) .......................... 2013 1 0270053

(51) Int. Cl.
*H01L 21/3065* (2006.01)
*G02F 1/1335* (2006.01)
(Continued)

(52) U.S. Cl.
CPC ........ *G02F 1/133516* (2013.01); *G02F 1/1368* (2013.01); *H01L 21/3065* (2013.01); *H01L 27/1248* (2013.01); *H01L 27/1259* (2013.01); *G02F 2001/136222* (2013.01)

(58) Field of Classification Search
CPC ........... G02F 1/133516; G02F 1/1368; H01L 27/1248; H01L 27/1259; H01L 21/3065
See application file for complete search history.

(56) References Cited

U.S. PATENT DOCUMENTS

| 6,300,152 B1 * | 10/2001 | Kim | .................... G02F 1/13458 349/138 |
| 2005/0001966 A1 * | 1/2005 | Kim | .................. G02F 1/136227 349/139 |

(Continued)

FOREIGN PATENT DOCUMENTS

| CN | 101047198 A | 10/2007 |
| CN | 101409263 A | 4/2009 |

(Continued)

OTHER PUBLICATIONS

Chinese Office Action of Chinese Application No. 201310270053.0 with English translation, mailed Sep. 12, 2014.

(Continued)

*Primary Examiner* — Allan R Wilson
(74) *Attorney, Agent, or Firm* — Collard & Roe, P.C.

(57) ABSTRACT

A COA substrate and its fabrication method as well as a display device are disclosed. The method includes steps of: forming a TFT (10) on a base substrate (1); forming a color film layer (6) pattern on the base substrate (1) having the TFT (10) formed thereon; forming a pattern which includes a color film via hole (5) on the color film layer (6) through a patterning process, the patterning process includes an ashing process; and forming a pattern comprising a pixel electrode (7) on the base substrate (1). The pixel electrode (7) is electrically connected to a drain electrode (12) of the TFT (10) by way of the color film via hole (5).

8 Claims, 3 Drawing Sheets

(51) Int. Cl.
  *G02F 1/1368* (2006.01)
  *H01L 27/12* (2006.01)
  *G02F 1/1362* (2006.01)

(56) References Cited

U.S. PATENT DOCUMENTS

| | | | | |
|---|---|---|---|---|
| 2005/0059193 | A1* | 3/2005 | Yoneya | H01L 21/32051 438/151 |
| 2005/0253991 | A1* | 11/2005 | Chang | G02F 1/136213 349/147 |
| 2006/0066777 | A1* | 3/2006 | Kim | G02B 5/201 349/106 |
| 2007/0194677 | A1 | 8/2007 | Liu et al. | |
| 2008/0032431 | A1 | 2/2008 | Hsu et al. | |
| 2010/0157211 | A1* | 6/2010 | Kim | G02F 1/133516 349/106 |
| 2013/0126876 | A1* | 5/2013 | Shin | H01L 27/124 257/59 |
| 2014/0125931 | A1 | | 5/2014 | Niu |

FOREIGN PATENT DOCUMENTS

| | | |
|---|---|---|
| CN | 101634789 A | 1/2010 |
| CN | 102707484 A | 10/2012 |
| CN | 102810571 A | 12/2012 |
| CN | 103325732 A | 9/2013 |

OTHER PUBLICATIONS

International Search Report, International Preliminary Report on Patentability and Written Opinion of the International Searching Authority of PCT/CN2013/087973 in Chinese, mailed Apr. 3, 2014.
Third Chinese Office Action of Chinese Application No. 201310270053.0, mailed Jun. 18, 2015 with English translation.
English translation of the International Preliminary Report on Patentability and Written Opinion of the International Searching Authority of PCT/CN2013/087973, issued Dec. 29, 2015.

\* cited by examiner

COA SUBSTRATE, METHOD FOR FABRICATING THE SAME AND DISPLAY DEVICE

CROSS REFERENCE TO RELATED APPLICATIONS

This application is the National Stage of PCT/CN2013/087973 filed on Nov. 27, 2013, which claims priority under 35 U.S.C. §119 of Chinese Application No. 201310270053.0 filed on Jun. 28, 2013, the disclosure of which is incorporated by reference.

FIELD OF THE ART

Embodiments of the disclosure relate to the field of display technology, more particularly, to a COA substrate, a method for fabricating the same and a display device.

BACKGROUND

A Thin Film Transistor Liquid Crystal Display (TFT-LCD) comprises a TFT array substrate, a color filter substrate and a liquid crystal layer. The color filter substrate is a principal component of the LCD and used for displaying color images. In early technologies for fabricating TFT-LCDs, a color film layer and a TFT functioning as a driving switch are respectively formed on two different substrates and disposed on different sides of the liquid crystal layer. However, such a configuration will make the aperture ratio of a display panel low, which will in turn affect the brightness and picture quality of the display panel. Recently, the market requirement on the aperture ratio and the brightness of the available display panels is increased, consequently, the manufacturers developed a Color filter on Arrays (COA) technology where the color filter layer is directly formed on the array substrate in response to the market requirement. That is, the color film layer is formed on the same and one substrate as the TFT, which not only increases the aperture ratio and the brightness of the display panel, but also avoids the problems caused by forming the color film layer and the TFT on different substrates.

As illustrated in FIG. 1, a color filter array substrate (that is, a COA substrate) formed by the known COA technology comprises a plurality of pixel units defined by a plurality of gate lines and a plurality of data lines, each pixel unit comprises a TFT 10, a color film layer 6 and a pixel electrode 7, the color film layer 6 is typically made up of three color organic resin layers, i.e. Red, Green and Blue (R, G, B) organic resin layers; moreover, a resin planarized layer (not shown in the figure) is formed on surfaces of the organic resin layers. The pixel electrode 7 is electrically connected to the drain electrode 12 of the TFT by way of a color film via hole 5'.

With the ever increasing of the resolution of the LCDs, the size of the pixel units in the display panel is ever decreasing. For example, for a display with a resolution of 400 ppi, the size of the pixel unit is typically about 25 μm*25 μm. However, the variation amount in diameter of the color film via hole 5' will be large if the color film via hole 5' is formed through the exposing and developing processes by using a mask. Accordingly, the maximum diameter of the color film via hole 5' becomes large. For example, while the diameter variation amount is about 8 μm, the maximum diameter of the color film via hole 5' is about 25 μm, which severely affects the aperture ratio of the pixel unit.

SUMMARY

An embodiment of the disclosure provides a method for fabricating a COA substrate, with an aim of solving the problem of the color film via hole formed through the known process having a large maximum diameter and a large diameter variation amount as to severely affect the aperture ratio of the pixel unit.

A first aspect of the disclosure provides a method for fabricating a COA substrate, comprising:
  forming a TFT on a base substrate;
  forming a pattern of a color film layer on the base substrate having the TFT formed thereon;
  forming a pattern which comprises a color film via hole on the color film layer through a patterning process, the patterning process comprising an ashing process;
  forming a pattern comprising a pixel electrode on the base substrate, the pixel electrode being electrically connected to a drain electrode of the TFT by way of the color film via hole.

A second aspect of the disclosure provides a COA substrate fabricated using the above method.

A third aspect of the disclosure provides a display device comprising the above COA substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

1: base substrate; 2: gate electrode; 3: gate insulation layer; 4: active layer pattern; 5,5': color film via hole; 6: color film layer; 7: pixel electrode; 8: passivation layer; 9: common electrode; 10: TFT; 11: source electrode; 12: drain electrode; 13: photoresist; 14: transparent protection layer; 15: protection layer via hole.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiment 1

In the fabrication process of the COA substrate, the known process for forming the color film via hole comprises the exposing and developing processes by using a mask. The principle of the developing process is to dissolve the color film layer by using a developer with a certain concentration, thereby forming the pattern of the color film via hole. To ensure the developing effect, the concentration of the developer, the developing time and the developing temperature needs to be controlled. If the condition is not well controlled, the diameter variation amount of the formed color film via hole (that is the difference between the diameters at both ends of the color film via hole) can be easily made large, and the maximum diameter is also large, thereby severely affecting the aperture ratio of the pixel unit. The embodiment of the disclosure provides a method for fabricating a COA substrate, which can reduce the diameter variation amount of the color film via hole and the maximum diameter.

Figure 4:
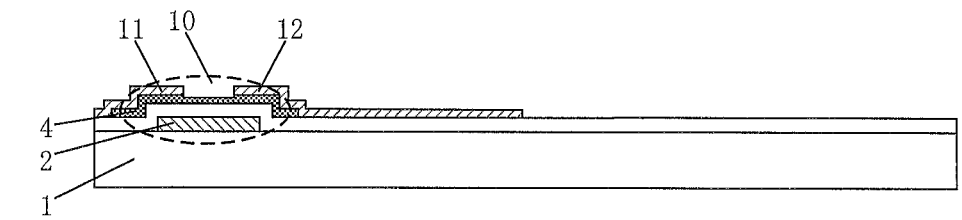
FIGS. 4~11 schematically illustrate a procedure for fabricating the COA substrate of FIG. 2.

In connection with FIGS. 2 to 11, a method for fabricating the COA substrate of the embodiment of the disclosure comprises the following steps:

101: forming a TFT on a base substrate;

With reference to FIG. 4, a TFT 10 is first formed on a base substrate 1. The base substrate 1 is made from a transparent material and has good light transmittance; typically, it is a glass substrate, a quartz substrate or a transparent resin substrate;

In an embodiment, the COA substrate comprises a base substrate 1, a plurality of pixel units arranged as a matrix is formed on the base substrate 1, each pixel unit comprises at least one TFT.

The TFT is a top-gate TFT or a bottom-gate TFT. In the following, a detailed procedure for forming the TFT will be described by taking the bottom-gate TFT as an example, and the procedure comprises:

First, a pattern comprising a gate electrode 2 is formed on the base substrate 1. As an example, a gate metal film (not shown) is formed on the base substrate by using evaporation deposition, sputtering and similar processes, and then the pattern of the gate electrode 2 is formed on the gate metal film through a patterning process. The patterning process for example comprises processes of applying a photoresist on the gate metal film, exposing by using a regular mask, developing, etching and peeling the photoresist, wherein etching is performed by using wet etching in an instance;

Then, a gate insulation film 3, an active film (not shown) and a source/drain (S/D) metal film (not shown) are sequentially formed on the pattern comprising the gate electrode 2, wherein the active film comprises a semiconductor film and a doped semiconductor film, and the doped semiconductor film is disposed above the semiconductor film. In the embodiment, patterns of a source electrode 11 and a drain electrode 12 are respectively formed through multiple patterning processes, or they are formed simultaneously through a single patterning process. For example, forming the patterns of the source electrode 11 and the drain electrode 12 through multiple patterning processes comprises:

First, the gate insulation film 3 and the active film are formed on the pattern of the gate electrode 2 by using deposition, coating or sputtering and the like, then a pattern of the active layer 4 is formed through a single patterning process by using a regular mask;

Then, the S/D metal film is formed on the pattern comprising the active layer 4 by using evaporation deposition, sputtering and the like, and the patterns of the source electrode 11 and the drain electrode 12 are formed through a single patterning process by using a regular mask. The patterning process for example comprises processes of applying a photoresist on the S/D metal film, exposing the photoresist by using a regular mask, developing, etching and peeling the photoresist, wherein the etching is performed by using wet etching in an instance, to form the patterns comprising the source electrode 11 and the drain electrode 12. Then, the doped semiconductor layer between the source electrode 11 and the drain electrode 12 as well as a part of the semiconductor layer between the source electrode 11 and the drain electrode 12 are removed by using dry etching.

As an example, forming the patterns of the source electrode 11 and the drain electrode 12 through a single patterning process comprises:

First, a gate insulation film 3, an active film and a S/D metal film are sequentially formed on the gate electrode pattern 2 by using evaporation deposition, coating or sputtering and the like, then the patterns of the source electrode 11 and the drain electrode 12 are formed through a single patterning process by using a half-tone or a gray-tone mask. The patterning process for example comprise:

First, a layer of photoresist (not shown) is applied on the S/D metal film;

Then, the half-tone or gray-tone mask is used to expose the photoresist, allowing the photoresist to form a photoresist-completely-removed region, a photoresist-completely retained region and a photoresist-partially-retained region, wherein the photoresist-completely retained region corresponds to the region having the source electrode pattern 11 and the drain electrode pattern 12, the photoresist-partially-retained region corresponds to the region having the channel between the source electrode pattern 11 and the drain electrode pattern 12, and the photoresist-completely-removed region corresponds to the region other than the above patterns. After developing, the thickness of the photoresist in the photoresist-completely retained region remains the same, the photoresist in photoresist-completely-removed region is completely removed, and the thickness of photoresist in the photoresist-partially-retained region is reduced;

Next, a first etching process is performed to completely remove the S/D metal film and the active film below the photoresist-completely-removed region. For example, the S/D metal film below the photoresist-completely-removed region is removed completely by using wet etching, and then the active film therebelow is removed by using dry etching, to form the pattern comprising the active layer 4. Meanwhile, the photoresist-completely-retained region and the photoresist-partially-retained region is thinned through the dry etching;

After that, the photoresist in the photoresist-partially-retained region is removed by ashing process to expose the S/D metal film in this region;

Next, a second etching process is used to completely remove the S/D metal film, the doped semiconductor film and the semiconductor film with a certain thickness under the photoresist-partially-retained region, to expose the semiconductor film in this region, and to form the channel pattern between the source electrode 11 and the drain electrode 12. For example, the S/D metal film under the photoresist-partially-retained region is removed first by using wet etching, and then the remaining doped semiconductor film and the semiconductor film with a certain thickness is removed by dry etching, to form the channel pattern.

Finally, the remaining photoresist is removed, to form the pattern comprising the source electrode 11 and the drain electrode 12.

Figure 5:
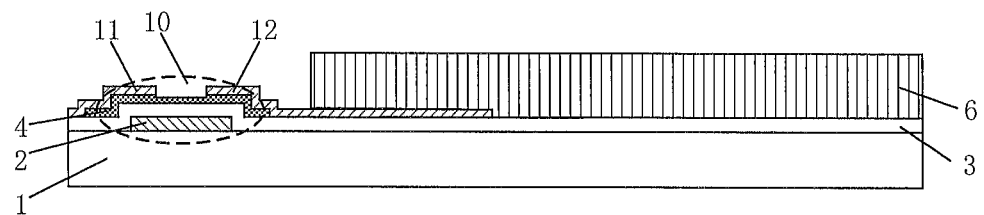

102: forming a pattern of a color film layer on the base substrate having the pattern comprising the source electrode and the drain electrode formed thereon;

In connection with FIG. 5, the color film layer 6 is made up of a red pixel (not shown), a green pixel (not shown) and a blue pixel (not shown), patterns of the red pixel, the green pixel and the blue pixel are formed respectively through a single patterning process. In the following, the procedure for forming the pixel pattern will be described by taking the red pixel as an example, and the procedure comprises:

First, a layer of red pixel resin layer (not shown) is coated on the whole base substrate 1, wherein the pixel resin layer is typically a photosensitive resin such as acrylic acid resin or other carboxylic acid type pigment resin; then a regular mask is used to form the red pixel pattern through a single patterning process.

Figure 3:
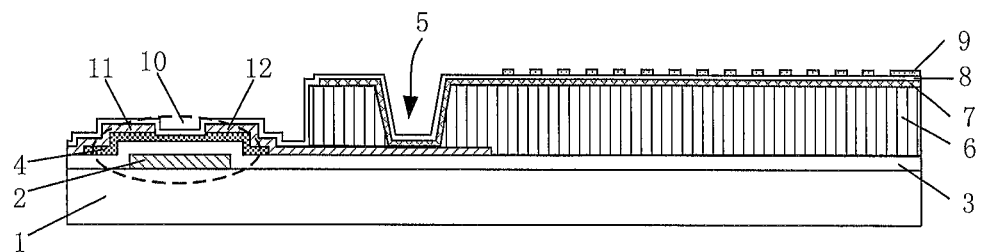
FIG. 3 schematically illustrates a second configuration of a COA substrate in accordance with an embodiment of the disclosure.

103: forming a pattern comprising a color film via hole on the color film layer through a patterning process, the patterning process comprising an ashing process;

In connection with FIG. 3, the step 103 for example comprises:

First a mask is used to expose the color film layer 6 to form a color film layer-retained region and a color film layer-removed region, wherein the color film layer-removed region comprises a region of the color film via hole 5; then an ashing process is used to remove the color film layer 6 in the color film layer-removed region to form the pattern comprising the color film via hole 5.

By controlling the power, gas pressure of the ashing process and the flux of the ashing gas, the diameter variation amount of the formed color film via hole 5 is 2~3 µm, and the maximum diameter is smaller than 10 µm. As a result, when realizing the connection between the pixel electrode and the drain electrode, the problem of the diameter of the color film via hole 5 being so large as to reducing the aperture ratio of the pixel unit is solved. Herein, the power of the ashing process is in the range of 4500 W~7500 W, the gas pressure is in the range of 13.3 Pa~40 Pa, and the flux of the ashing gas is in the range of 2000 ml~2500 ml/minute.

In the embodiment, a projection exposure machine is used to expose the color film layer 6. Since the resolution of the projection exposure machine is high and the size deviation is low, it facilitates the formation of a color film via hole 5 with a smaller diameter in subsequent process.

Figure 6:
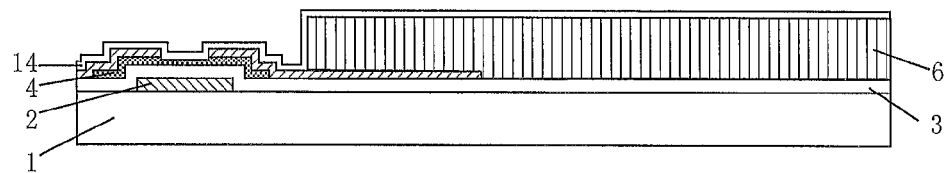
Figure 7:
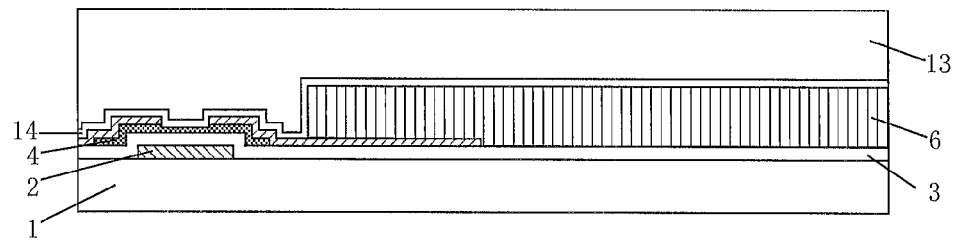

Furthermore, before forming the pattern comprising the color film via hole 5 in the color film layer 6 through the patterning process, a transparent protection layer 14 as illustrated in FIG. 6 is further formed on the color film layer 6 by evaporation deposition, coating or sputtering and the like. The patterning process for forming the color film via hole 5 comprises photoresist application, photoresist exposing and developing, transparent protection layer etching and color film layer ashing. Since the color film layer needs not be directly exposed, the influence on the maximum diameter of the color film via hole 5 caused by inaccurate control of the exposure amount is reduced. In connection with FIGS. 7~10, the patterning process for example comprises:

As illustrated in FIG. 7, a layer of photoresist 13 is first coated on the base substrate 1. For example, the photoresist 13 covering the whole base substrate 1 is coated on the color film layer 6.

Figure 1:
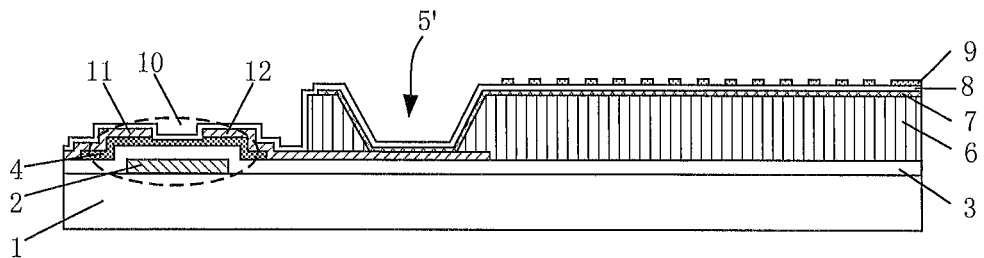
FIG. 1 schematically illustrates a configuration of a known COA substrate.
Figure 2:
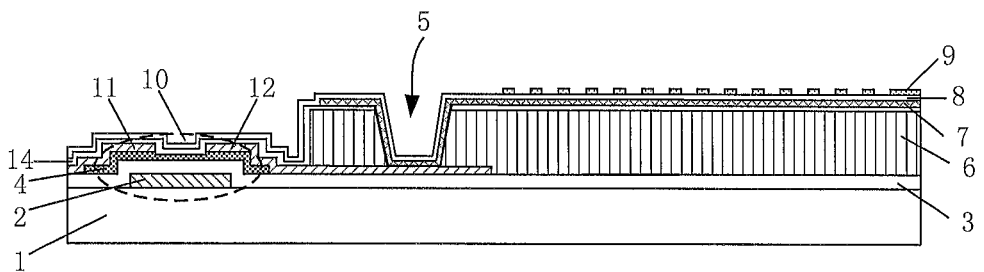
FIG. 2 schematically illustrates a first configuration of a COA substrate in accordance with an embodiment of the disclosure.
Figure 8:
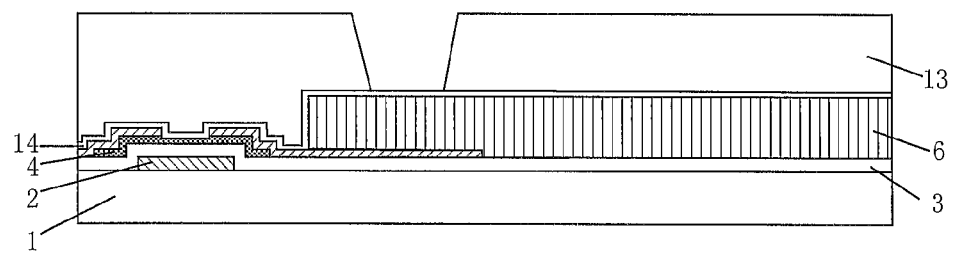
Figure 9:
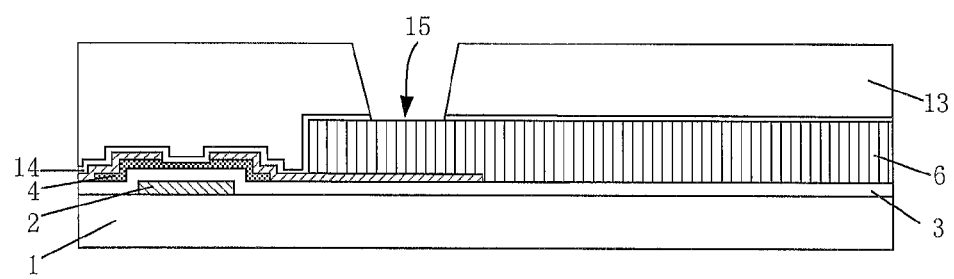

Then, a mask is used to expose the photoresist 13 by using a projection exposure machine. Since the resolution of the projection exposure machine is high and the size deviation is low, it facilitates the formation of a color film via hole 5 with a smaller diameter in subsequent process;

After that, the photoresist 13 is developed, to form a photoresist-retained region and a photoresist-removed region, wherein the photoresist-removed region comprises the region of the color film via hole, and the photoresist-retained region corresponds to regions of other patterns, as illustrated in FIG. 8;

Then, the transparent protection layer 14 in the photoresist-removed region is etched off, as illustrated in FIG. 9, to form the pattern comprising the protection layer via hole 15, and positions of the protection layer via hole 15 and the color film via hole 5 correspond to each other, thus, the pixel electrode 7 is electrically connected to the drain electrode 12 of the TFT 10 by way of the protection layer via hole 15 and the color film via hole 5, as illustrated in FIG. 2. Herein, the transparent protection layer 14 is made of a transparent insulating material, such as one or two of $SiN_x$, $SiO_x$, $SiON_x$, or of a transparent metal oxide material, such as ITO or IZO.

Figure 10:
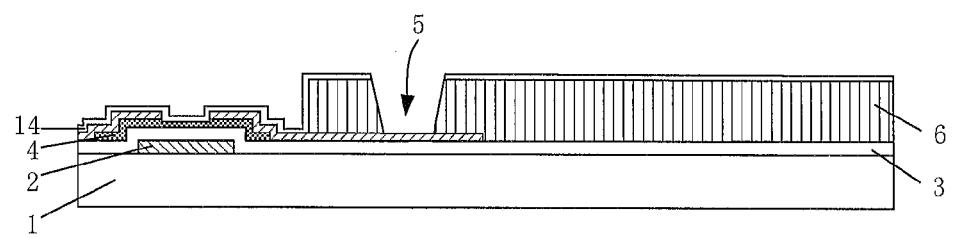

Finally, an ashing process is used to remove the color film layer 6 in the photoresist-removed region to form the pattern comprising the color film via hole 5, as illustrated in FIG. 10.

104: forming a pattern comprising a pixel electrode on the base substrate, the pixel electrode is electrically connected to a drain electrode of the TFT by way of the color film via hole.

Figure 11:
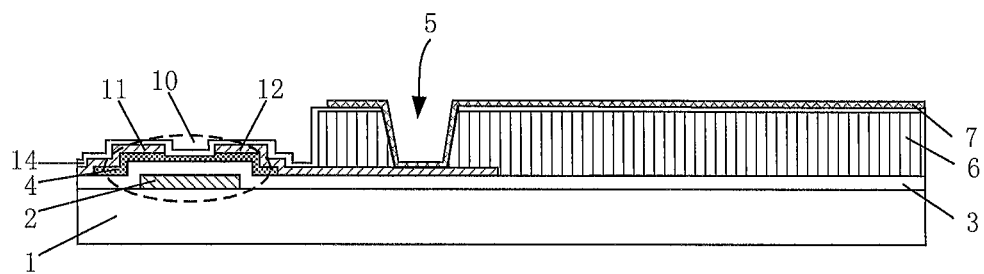

In connection with FIG. 11, for example, forming the pattern comprising the pixel electrode 7 on the base substrate 1 comprises:

First, a transparent conductive film (not shown) is formed on the color film via hole 5 by using coating, evaporation deposition or sputtering. Then, a photoresist (not shown) is coated on the transparent conductive layer, and then exposed and developed by using a mask to form a photoresist-retained region and a photoresist-removed region, wherein the photoresist-retained region comprises a region forming the pixel electrode 7. After that, the transparent conductive metal layer under the photoresist-removed region is removed by wet etching to form the pixel electrode 7. Finally, the remaining photoresist is peeled.

Herein, the pixel electrode 7 is electrically connected to the drain electrode 12 of the TFT by way of the color film via hole 5, and the color film layer 6 corresponds to the location of the pixel electrode 7.

In connection with FIG. 2 and FIG. 3, for an ADS LCD, when the common electrode 9 is disposed above the pixel electrode 7, after forming the pixel electrode 7, a passivation layer 8 overlaying the whole base substrate 1 is also formed on the pixel electrode 7 by coating, evaporation deposition or sputtering. Then, a pattern comprising the common electrode 9 is formed on the passivation layer 8. For example, a transparent conductive film (not shown) is first formed on the passivation layer 8 by coating, evaporation deposition or sputtering, then, a photoresist (not shown) is coated on the transparent conductive layer, and then exposed and developed by using a mask to form a photoresist-retained region and a photoresist-removed region, wherein the photoresist-retained region comprises a region forming the common electrode 9. After that, the transparent conductive layer in the photoresist-removed region is removed by wet etching to form the common electrode 9. Finally, the remaining photoresist is peeled. Herein, the common electrode 9 is a slit electrode, the pixel electrode 7 is a plate electrode or a slit electrode. If the pixel electrode 7 is a slit electrode, the slit position of the pixel electrode 7 and the slit position of the common electrode 9 correspond to each other. When the common electrode 9 is disposed below the pixel electrode 7, the pixel electrode 7 is a slit electrode, the common electrode 9 is a plate electrode or a slit electrode. If the common electrode 9 is a slit electrode, the slit position of the pixel electrode 7 and the slit position of the common electrode 9 correspond to each other.

Embodiment 2

Based on the same inventive concept, the embodiment provides a COA substrate made with the fabrication method of Embodiment 1. As the diameter of the color film via hole formed by the fabrication method is small and the diameter variation amount is small, the problem of the aperture ratio of the pixel units of the COA substrate being affected by the color film via hole is effectively solved.

Embodiment 3

The embodiment provides a display device which employs the COA substrate of Embodiment 2, thereby significantly improving the display quality of the display device.

In the method for fabricating the COA substrate provided by the embodiment of the disclosure, the color film via hole is formed by removing the color film layer in the color film via hole region by ashing process, which reduces the diameter variation amount of the color film via hole and the maximum diameter, effectively solves the problem of the aperture ratio of the pixel unit of the COA substrate being reduced by the size of the color film via hole being too large, and improves the display quality of the display device.

What are described above is related to the illustrative embodiments of the disclosure only and not limitative to the scope of the disclosure; the scopes of the disclosure are defined by the accompanying claims.

What is claimed is:

1. A method for fabricating a COA substrate, comprising:
   forming a TFT on a base substrate;
   forming a pattern of a color film layer on the base substrate having the TFT formed thereon;
   forming a pattern which comprises a color film via hole on the color film layer through a patterning process, the patterning process comprising an ashing process;
   forming a pattern comprising a pixel electrode on the base substrate, the pixel electrode being electrically connected to a drain electrode of the TFT by way of the color film via hole,
   wherein before forming the pattern comprising the color film via hole on the color film layer through a patterning process, the method further comprises: forming a transparent protection layer on the color film layer,
   wherein forming the pattern comprising the color film via hole on the color film layer through a patterning process comprises:
   applying a photoresist on the transparent protection layer, exposing and developing the photoresist to form a photoresist-retained-region and a photoresist-removed region, the photoresist-removed region comprises a region of the color film via hole:
   etching the transparent protection layer in the photoresist-removed region to form a pattern comprising a protection layer via hole, locations of the protection layer via hole and the color film via hole correspond to each other;
   removing the color film layer in the photoresist-removed region by using an ashing process to form the pattern comprising the color film via hole.

2. The method of claim 1, wherein the transparent protection layer is a transparent insulating material or a transparent metal oxide material.

3. The method of claim 1, wherein after forming the pattern comprising the pixel electrode on the base substrate, the method further comprises: forming a passivation layer on the pixel electrode.

4. The method of claim 3, wherein after forming the passivation layer on the pixel electrode, the method further comprises: forming a pattern which comprises a common electrode on the passivation layer.

5. A method for fabricating a COA substrate, comprising:
   forming a TFT on a base substrate;
   forming a pattern of a color film layer on the base substrate having the TFT formed thereon;
   forming a pattern which comprises a color film via hole on the color film layer through a patterning process, the patterning process comprising an ashing process;
   forming a pattern comprising a pixel electrode on the base substrate, the pixel electrode being electrically connected to a drain electrode of the TFT by way of the color film via hole
   wherein forming the pattern comprising the color film via hole on the color film layer through a patterning process comprises the following steps:
   exposing the color film layer to form a color film layer-retained region and a color film layer-removed region, the color film layer-removed region comprises a region of the color film via hole;
   removing the color film layer in the color film layer-removed region by an ashing process to form the pattern comprising the color film via hole.

6. The method of claim 5, wherein the color film layer is exposed by using a projection exposing machine.

7. The method of claim 5, wherein after forming the pattern comprising the pixel electrode on the base substrate, the method further comprises: forming a passivation layer on the pixel electrode.

8. The method of claim 7, wherein after forming the passivation layer on the pixel electrode, the method further comprises: forming a pattern which comprises a common electrode on the passivation layer.

* * * * *